United States Patent [19]
Sasaki et al.

[11] Patent Number: 5,801,375
[45] Date of Patent: Sep. 1, 1998

[54] SAMPLER MODULE, SAMPLING WAVEFORM MEASUREMENT DEVICE USING THE SAMPLE MODULE, AND SAMPLING WAVEFORM MEASUREMENT METHOD

[75] Inventors: Kouji Sasaki; Takao Sakurai; Takeshi Konno; Wataru Narazaki; Masaichi Hashimoto, all of Tokyo, Japan

[73] Assignee: Advantest Corporation, Tokyo, Japan

[21] Appl. No.: 651,054

[22] Filed: May 21, 1996

[30]    Foreign Application Priority Data

| May 23, 1995 | [JP] | Japan | 7-148331 |
| Feb. 13, 1996 | [JP] | Japan | 8-025480 |
| Feb. 13, 1996 | [JP] | Japan | 8-025481 |

[51] Int. Cl.⁶ ............................................. H01J 3/14
[52] U.S. Cl. .................................. 250/216; 324/76.24
[58] Field of Search .................. 250/214 R, 214.1, 250/216; 257/431, 432; 324/96, 76.24

[56]             References Cited

U.S. PATENT DOCUMENTS 4,978,910  12/1990  Knox et al. ................. 324/96
5,187,449  2/1993  May ............................ 250/214.1

*Primary Examiner*—Que Le
*Attorney, Agent, or Firm*—Oblon, Spivak, McClelland, Maier & Neustadt, P.C.

[57]             ABSTRACT

A sampler module is disclosed for use in a sampling waveform measurement device that samples subject signals and measures the waveform of the signals. The module is constructed by accommodating within a metal container: a laser diode driver circuit that receives laser drive sampling pulse signals from the outside and supplies pulse drive signals by a gain switching method, a laser diode that receives the drive signals from the LD driver circuit and generates optical probe pulse light, a sampling photoconductor that performs switching in accordance with irradiated light pulses and samples the subject signals, a condenser that focuses optical probe pulse light from the laser diode upon the photoconductor, and cooling temperature control means that maintains the temperature of the laser diode at a fixed temperature.

15 Claims, 15 Drawing Sheets

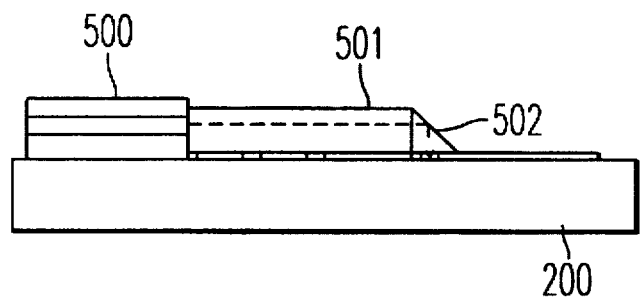
*FIG. 11*
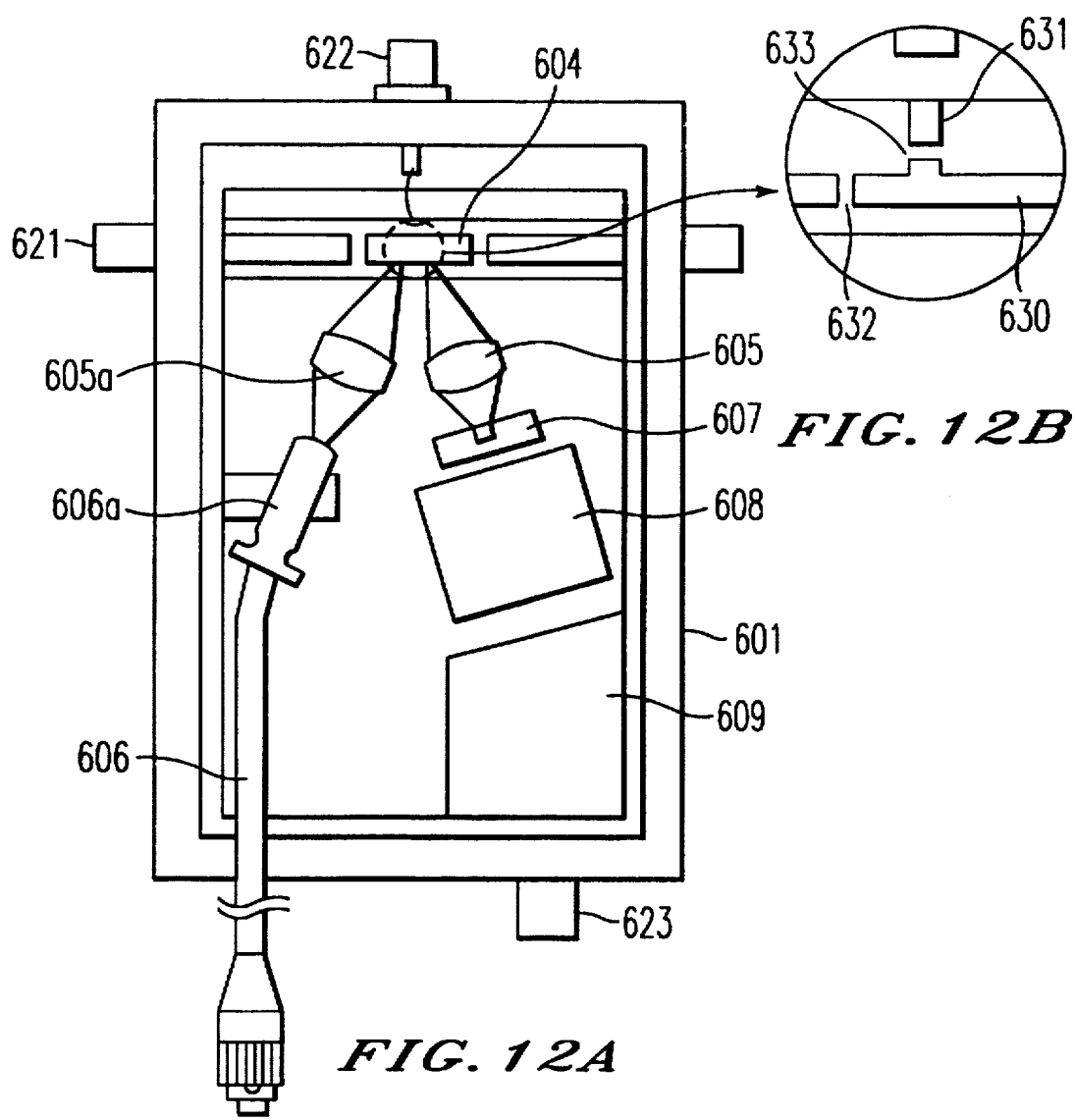
*FIG. 12B*
*FIG. 12A*

SAMPLER MODULE, SAMPLING WAVEFORM MEASUREMENT DEVICE USING THE SAMPLE MODULE, AND SAMPLING WAVEFORM MEASUREMENT METHOD

BACKGROUND OF THE INVENTION

1. Field of the Invention

The present invention relates to a sampling waveform measurement device that measures the waveform of subject signals that are repeated and continuously generated, and also relates to a sampling waveform measurement method. In addition, the present invention relates to an optical sampler module used in such a sampling waveform measurement device.

2. Description of the Related Art

As apparatus for measuring the waveform of high-speed pulse signals (the subject signals) in the prior art, devices which perform electrical sampling of pulse signals using a sampling scope are well known. However, measurement of high-speed pulses on the order of picoseconds is complicated by the limited sampling speed of electrical sampling.

Sampling waveform measurement devices that use an optical sampling means are one type of device that allow measurement of high-speed pulse signals on the picosecond order, and FIG. 1 shows one example of such a sampling waveform measurement device.

In FIG. 1, pulse generator 10 generates the subject signals 40. The subject signals 40 generated by this pulse generator 10 are fed to the input terminal of a sampling photoconductor 9 and terminated by transmission impedance.

Sampling photoconductor 9 carries out sampling of the subject signals 40 and is constructed from, for example, detection means 11 in which coplanar lines 12, which are metal film wiring, are formed on an InP (Indium-Phosphorus) substrate, which is a semi-insulating substrate, doped with Fe (Iron), with a pair of gap electrodes 13 formed in coplanar wiring 12. Opposed electrodes or comb electrodes are employed as gap electrodes 13 with an ultra-fine gap of several μm or less.

In the above-described detection means 11, the gap electrodes 13 are in an isolated state when not irradiated, but when irradiated by laser light, have an electrical conductivity on the order of several Ω. Accordingly, detection means 11 can be used as a high-speed switch when the gap electrodes 13 are irradiated by a rapidly repeating pulse laser light, and this principle is used to optically sample the subject signals 40.

Arithmetic section 16 generates a timing signal that synchronizes the measurement system. The timing signals generated by this arithmetic section 16 are inputted to pulse generator 10, mode-locked laser 21, stage driver 27, and A/D converter 15.

Pulse generator 10 generates a subject signal 40 for every timing signal inputted from arithmetic means 16, and these subject signals 40 are inputted to one end of coplanar line 12.

Mode-locked laser 21 is driven in synchronism with pulse generator 10 by timing signals inputted from arithmetic means 16 and generates optical probe pulses 42 of ultra-short pulse width. The pulse width of these optical probe pulses 42 is 80 fs (80 femtoseconds), and the repeated sampling frequency is a low frequency on the order of 100 MHz.

The optical probe pulses 42 generated by mode-locked laser 21 advance directly, reach movable mirror 26 of delay means 25, and are deflected 180° by movable mirror 26. The optical probe pulses 42 reflected by movable mirror 26 then proceed to mirror 28 and are deflected 90° by mirror 28. The optical probe pulses 42 reflected by mirror 28 are focused by lens 29 and then irradiated upon gap electrode 13 of detection means 11.

At detection means 11, gap electrode 13 performs a switching operation in response to irradiated optical probe pulses 42, and subject pulse signals 40 inputted at one end of coplanar line 12 are sampled by this switching action. The timing of this sampling can be delayed through a differential in optical path length resulting from movement of movable mirror 26, thereby allowing successive sampling of the entire pulse waveform of subject pulse signals 40.

Delay means 25 has an optical construction allowing variation of the optical path delay time τ of the above-described sampling timing and is composed of movable mirror 26 and stage driver 27. Movable mirror 26 is constructed to allow movement back and forth with respect to the direction of the light path and is driven by stage driver 27. Stage driver 27 receives timing signals from arithmetic means 16 and drives movable mirror 26 either continuously or in steps.

In the sampling waveform measurement device shown in FIG. 1, gap electrode 13 of detection means 11 is irradiated by an optical probe pulses 42 having delay time τ, and the waveform level during this interval of irradiation is sampled.

The detected signals (analog signals) sampled at detection means 11 are amplified by lock-in amplifier 14 and then inputted to A/D converter 15. At A/D converter 15, the amplified analog signals are converted to digital signals in accordance with timing signals inputted from arithmetic means 16, and these digitized detection signals are supplied to arithmetic means 16, where deconvolution computation is performed for the supplied detection signals. The computation results are displayed on display means 17.

The delay time that can be obtained by movement of 10 cm by movable mirror 26 in the above-described delay means 25 is limited to a range of up to 667 ps, and consequently, measurement of the waveform of subject signals having a pulse width of several nanoseconds necessitates delay means that allows larger delays.

FIG. 2 shows an example of a sampling waveform measurement device having a delay synchronizing means for enabling measurement of subject signals having a pulse width of several nanoseconds. Such a device is constructed by interposing delay synchronizing means 20 between pulse generator 10 and mode-locked laser 21 of the construction shown in FIG. 1. This delay synchronizing means 20 is synchronized with pulse generator 10 and generates an accurate delay signal.

Pulse generator 10 and signal generator 31 are each phase-locked and oscillate in synchronism. Ramp signal generator 30 generates ramp signals 41 based on timing signals inputted from arithmetic means 16. These ramp signals 41 are inputted to an input terminal for phase shift of signal generator 31. Signal generator 31 phase modulates the inputted ramp signals 41 and generates accurate delay signals. These delay signals are inputted to a synchronizing circuit 22 of mode-locked laser 21, and optical probe pulses 42 are outputted by the mode-locked laser 21 based on the inputted delay signals.

FIG. 3 shows the structural principle for a case in which another optical variable delay means is employed in place of delay means 25, light modulator 35 being the optical variable delay means. Optical probe pulse 42 emitted by mode-locked laser 21 is passed through this light modulator 35 and directed toward electrode 13 of detection means 11. When an electric field or magnetic field is applied at this light modulator 35, the delay time τ of the light changes in proportion to the strength of the electric or magnetic field. Accordingly, delay time τ can be conferred upon optical probe pulse 42 by varying the voltage or current applied to light modulator 35, thereby enabling sampling of the pulse waveform of subject signals 40. Post-sampling processing is as in the above-described explanation. In this way, moving parts such as delay means 25 can be omitted through the use of a light modulator 35 which allows variation of delay time τ by simply varying voltage or current.

The foregoing explanation relates to a sampling waveform measurement device for cases in which signals subject to measurement are electric pulse signals, but when the subject signals are light pulse signals, waveform measurement can also be effected by a construction using a sampling photoconductor. A sampling waveform measurement device that measures the waveform of light pulse signals will next be described.

This type of sampling waveform measurement device employs a sampling photoconductor constructed from detection means (photoconductor) constructed by forming a coplanar line on a semiconductor substrate and forming two pairs of gap electrodes in the coplanar line. In this sampling photoconductor, sampling of subject light pulses is performed by operating one of the gap electrodes (hereinbelow referred to as "first electrode") constructed in the coplanar line of the detection means as a detector that performs photoelectric conversion of subject light pulses (or impulse response light pulses of a measurement element that takes the light pulses as input), and operating the other electrode (hereinbelow referred to as "second electrode") as a switch by the probe-shaped light pulses (optical probe pulses).

In a light pulse measurement device of this type of construction, subject light pulses are irradiated upon the first electrode of the coplanar line of the detection means as function x(t). Optical probe pulses are then passed through delay means, given a delay time τ, and irradiated upon the second electrode of the detection means, and the photoelectric-converted electric pulse signals x(t) inputted from the first electrode of coplanar line are sampled according to function h(t+τ) of the optical probe pulses. Output signal y(t) from the detection means thereupon becomes the crosscorrelation function waveform of x(t) and h(t+τ).

In other words, detection signal y(t) from the coplanar line of the detection means is conferred by:

$$y(t) = \int_{-\infty}^{+\infty} x(\tau)h(t+\tau)d\tau$$

The integral range, however, is from −∞ to =∞. The original waveform can be reconstructed through deconvolution of this detection signal y(t) in the arithmetic means, and this reconstructed waveform is displayed on the display section. FIG. 4 shows one example of this sampling waveform measurement device.

An outline construction of a sampling waveform measurement device includes source of subject light 510, detection means 511, amplifier (lock-in amplifier) 514, A/D conversion means 515, arithmetic means 516, display means 517, mode-locked laser oscillator 521, and delay circuit 525.

In addition to generating timing signals for synchronizing the measurement system, arithmetic means 516 performs a deconvolution computation in response to input of A/D converted detection signals from detection means 511, to be described hereinbelow. The timing signals generated by this arithmetic means 516 are inputted to subject light source 510, mode-locked laser oscillator 521, stage driver 527, and A/D conversion means 515. These timing signals may be synchronized to a measurement system employing as a standard specific signals other than from arithmetic means 516, but in this case, timing signals are transmitted from, for example, a computer.

Subject light source 510 generates subject light pulses 540 for every timing signal inputted from arithmetic means 516 in synchronism with mode-locked laser oscillator 521 which generates optical probe pulses. The subject light pulses 540 (or, although not shown, impulse response light pulses of a subject element that takes these subject light pulses 540 as input) are focused by lens 529a and directed upon first electrode 513a of detection means 511.

Mode-locked laser oscillator 521 is made up of synchronizing circuit 522, main laser 523, and excitation laser 524 and generates optical probe pulses 542 synchronized with subject light source 510 in accordance with timing signals inputted from arithmetic means 516. The pulse width of optical probe pulses 542 is, for example, 80 fs (80 femtoseconds=80×10$^{-15}$ seconds), and the repeat frequency is on the order of 100 MHz. The optical probe pulses 542 from this mode-locked laser oscillator 521 are directed by mirrors 528a and 528b to reach movable mirror 526 of delay circuit 525, where they are reflected 180° by movable mirror 526. The optical probe pulses 542 reflected by movable mirror 526 reach mirror 528c and are reflected 90° by movable mirror 526. The optical probe pulses 542 reflected by mirror 528c are focused by lens 529b and directed toward second electrode 513 of detection means 511.

Delay means 525 is a device for conferring delay time τ upon optical probe pulses 542 from mode-locked laser oscillator 521 and is composed of movable mirror 526 and stage driver 527. Under the power of stage driver 527, movable mirror 526 moves back and forth with respect to the direction of light, and by this movement confers a delay time τ upon the optical probe pulses 542. Stage driver 527 receives timing signals from arithmetic means 516 and drives movable mirror 526 either continuously or by steps. A movement of 1 μm by movable mirror 526 can confer a delay of 6.6 fs upon optical probe pulses 542 by the two-way passage through movable mirror 526. In other words, because the speed of light is 3×10$^8$ m/s, the delay time is:

$$(2 \times 10^{-6})/(3 \times 10^8 \text{ m/s}) = 6.6 \text{ fs}$$

Detection means 511 is made up of a photoconductive element (photoconductor) constructed by forming a conductive thin-film coplanar line 512 on, for example, an InP (indium-phosphorus) substrate, which is a semi-insulating substrate, doped with Fe (iron), and two pairs of electrodes having hyperfine gaps in this coplanar line 512. A direct-current power source is connected to one end of the coplanar line 512 to apply an electric field at the electrodes. First electrode 513a and second electrode 513b are opposing electrodes (more preferably, opposing comb electrodes) with the gap width of each electrode equal to or less than several μm. The gap width of these electrodes may also be equal to or less than 1μ. First electrode 513a effects a highly precise photoelectric conversion of subject light pulses 540, and second electrode 513b switches with high response to optical probe pulses 542. Within this detection means 511, the waveform levels of subject light pulses 540 are sampled while gradually shifting the delay time conferred upon optical probe pulses 542. The sampled detection signals are inputted to arithmetic means 516 by way of, for example, an amplifier 514 such as a lock-in amplifier and A/D conversion means 515.

Display means 517 displays the results of performing deconvolution computation in arithmetic means 516.

In a sampling waveform measurement device constructed as described hereinabove, subject light pulses 540 from subject light source 510 are photoelectric converted at first electrode 513a of detection means 511, and the photoelectric converted pulse signals are sampled at second electrode 513b in accordance with optical probe pulses 542 from mode-locked laser oscillator 521. Detection signals sampled in this manner are crosscorrelation function waveform y(t) as described hereinabove, and the original waveform can be found through deconvolution of this crosscorrelation function waveform y(t).

The sampled detection signals are amplified at amplifier 514 and A/D converted at A/D conversion means 515, following which they are inputted to arithmetic means 516 where deconvolution operation is performed. The results of this operation are then displayed at display means 517.

In this light pulse measurement device, sampling using optical probe pulses 542 delayed by each 1 μm movement of the movable mirror results in resolution of 6.6 fs. If the entire range of movement is, for example, 5 cm, a delay of 333 ps can be conferred and waveform measurement of subject pulses can be performed over an interval of 333 ps at a resolution of 6.6 fs.

However, each of the sampling waveform measurement devices described hereinabove entails the following problems.

Because mode-locked solid-state lasers are employed as the light source, these devices are not only large and extremely costly, but the large installation space required also detracts from their practicality or suitability for wide use. Furthermore, because sampling measurement is performed by directing space light on a photoconductor by way of optics such as condensers, alignment of the light axis is essential for every measurement. In addition, the use of a movable mirror, which necessitates a moving mechanism, compromises the portability of the device, and shifts in the light axis of the optics reduces the reproducibility of measurement results. Furthermore, the existence of a moving mechanism complicates the fabrication of a compact measurement device.

SUMMARY OF THE INVENTION

A first object of the present invention is to provide a compact and inexpensive sampler module incorporating an optical sampling system employing a semiconductor laser diode.

A second object of the present invention is to provide a compact sampling waveform measurement device using the sampler module that does not require alignment of light axes for each measurement.

A third object of the present invention is to provide a sampling waveform measurement method that is performed using the sampling waveform measurement device.

To achieve the above-described first object, a sampler module according to the present invention is a sampler module used in an optical sampling device that samples subject signals by irradiating short-pulse laser light, the sampler module accommodating in a metal container: an LD (Laser Diode) driver circuit that receives a laser-drive sampling pulse signals from the outside, and supplies pulse drive signals by a gain switching method; a laser diode that receives drive signals from the LD driver circuit and generates optical probe pulse light; a sampling photoconductor that performs switching in accordance with irradiated light pulses and samples the subject signals; a condenser that focuses the optical probe pulse light from the laser diode onto the photoconductor; and cooling temperature control means that maintains the temperature of the laser diode at a fixed temperature.

In the above-described sampler module, the LD chip on which the laser diode is formed can be fixed on the substrate on which the sampling photoconductor is formed. In this way, a sampler module can be realized in which alignment of light axes is obviated. Furthermore, if the laser diode is a surface emitting laser diode, a more compact optical sampler module having fewer parts can be realized.

To achieve the second object described hereinabove, a sampling waveform measurement device according to the present invention is a sampling waveform measurement device that samples subject signals and measures their waveform that includes:

the above-described sampler module;

a sampling pulse generator that generates sampling pulses synchronized with the subject signals;

supplying means that receives the sampling pulses, modulates these pulses by a prescribed square wave signal, and supplies these modulated sampling pulses to the sampler module as a laser drive sampling pulse signals;

reconstruction computation means that reconstructs the sampling detection signal sampled by the sampler module; and display means that displays the waveform reconstructed by the reconstruction computation means.

To achieve the third object described above, a sampling waveform measurement method according to the present invention is performed in a sampling waveform measurement device as described hereinabove, by which a trigger signal is obtained that is synchronized with the light source generating the subject signals, sampling pulses are generated that are synchronized with the trigger signal and moreover, of shifted frequency, and the sampling waveform of the subject signals is measured by changing the sampling phase based on the sampling pulse.

With the invention according to the foregoing description, a laser diode is employed in place of the mode-locked solid-state laser used in the prior art, and the apparatus is consequently not as large-scale as in the prior art. The device is also more compact because the laser diode, photoconductor, drive means, and lenses are all modularized. Finally, through a module construction, alignment of the optical axes need only be performed once at the time of fabricating the module, and the optical axes need not be aligned for each measurement as in the prior art.

In the present invention, a phase difference between the subject pulses and optical probe pulses is brought about in the sampling pulse generator, thereby eliminating the need for a moving mechanism employing an optical delay line as in the prior art.

As a result of the above-described features, the present invention offers a compact sampling waveform measurement device not available in the prior art. Furthermore, elimination of the moving mechanism employing an optical delay line allows for a less costly design.

In addition, the modularized construction eliminates the need for aligning optical axes for every measurement, thereby providing the effects of stabilizing measurement and improving reliability.

The present invention provides the further effect that, in a device in which a surface emitting laser diode is formed on a substrate which is in turn secured on the substrate of the photoconductor, lenses for focusing light can be omitted and a more compact device achieved.

Finally, by incorporating an LD chip that generates probe pulses on the sampling photoconductor, the optical axis alignment step can be omitted when fabricating the module, thereby allowing a significant reduction in module fabrication time and production costs and an increase in extraction rate.

The above and other objects, features, and advantages of the present invention will become apparent from the following description based on the accompanying drawings which illustrate an example of a preferred embodiment of the present invention.

BRIEF DESCRIPTION OF THE DRAWINGS

FIG. 11 shows the structure for a case in which an ordinary Fabry-Perot LD chip is secured on a photoconductor.

FIGS. 12(a) and 12(b) are an overhead view showing a sampler module according to one embodiment of the present invention in which the signals to be measured are optical pulse signals.

DETAILED DESCRIPTION OF THE PREFERRED EMBODIMENTS

Embodiments of the present invention will next be explained with reference to the accompanying figures. Separate explanations will be presented for a sampling waveform measurement device in which signals to be measured are electric pulse signals and a sampling waveform measurement device in which signals to be measured are optical pulse signals. Explanation will first be given for a sampling waveform measurement device and the sampler module used in the device for a case in which the subject signals are electric pulse signals.

Figure 1:
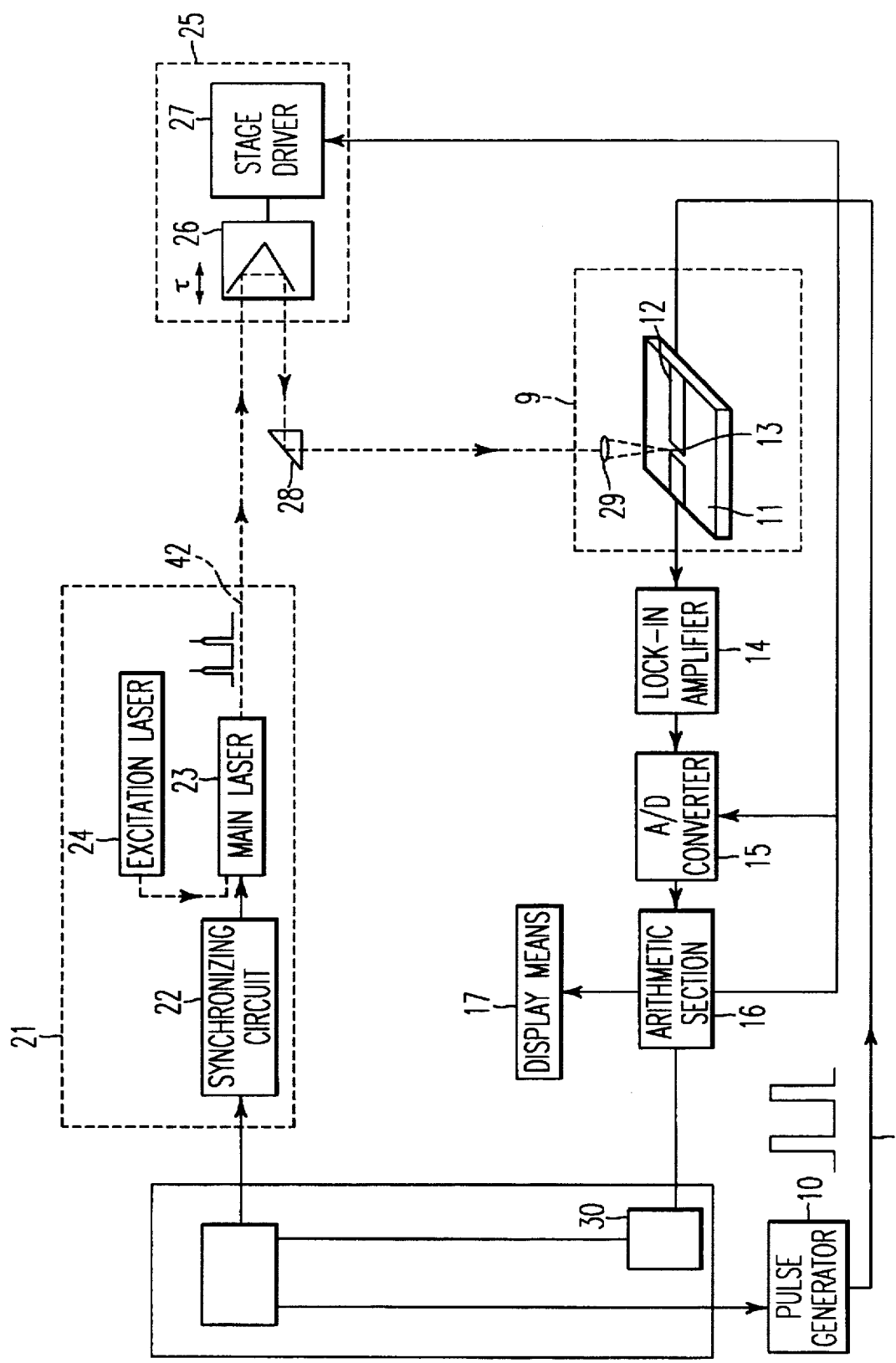
FIG. 1 is a block diagram showing an example of the construction of a prior-art sampling waveform measurement device in which the signals to be measured are electric pulse signals.
Figure 2:
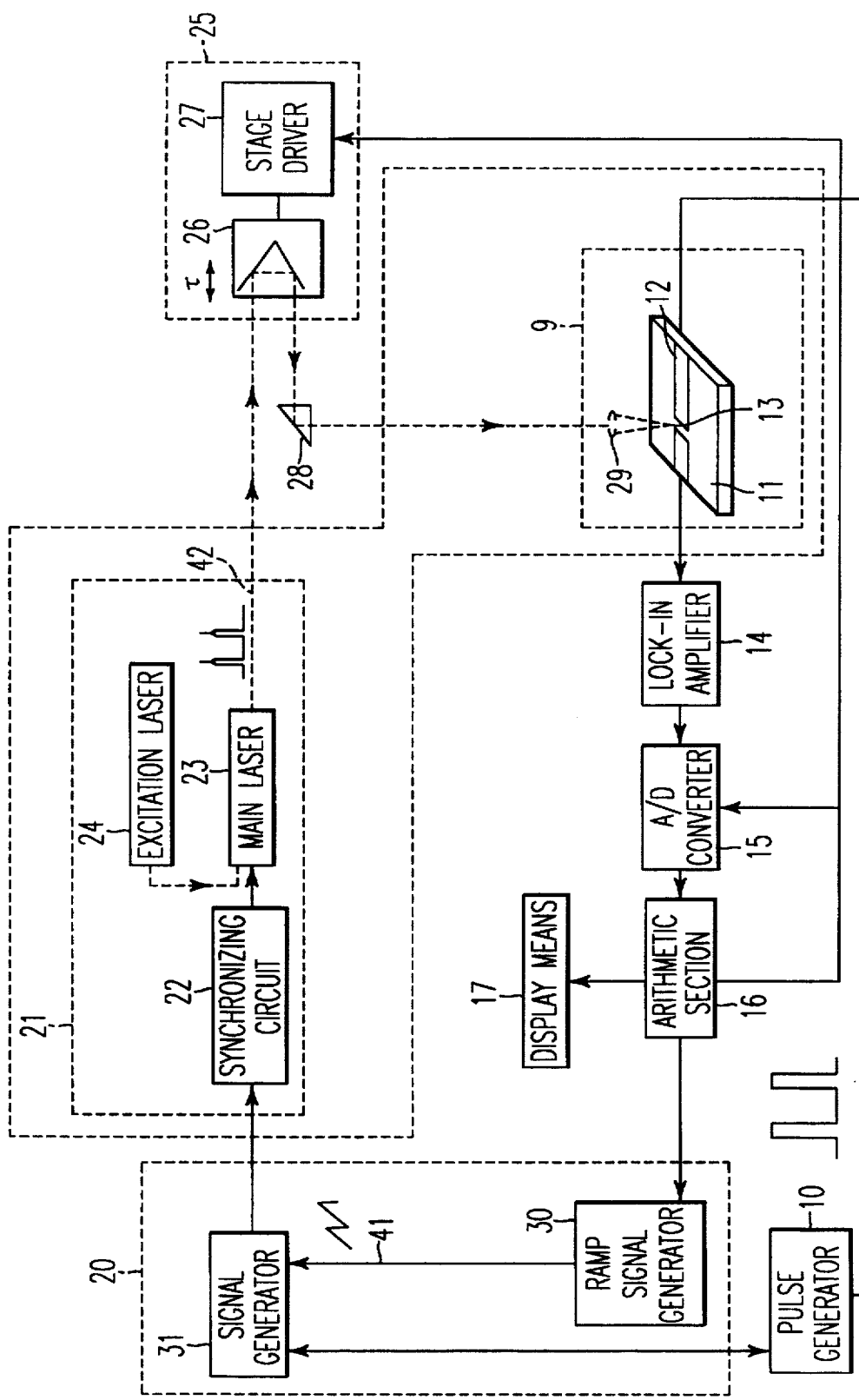
FIG. 2 is a block diagram showing an example of the construction of a sampling waveform measurement device supplemented by a prior-art delay synchronizing means.
Figure 3:
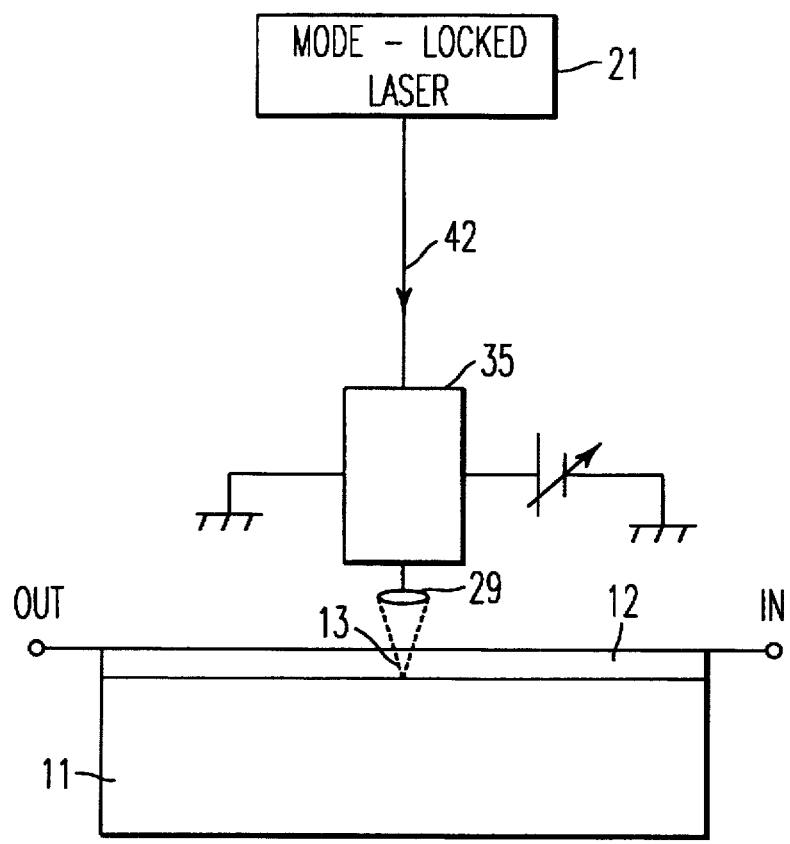
FIG. 3 is a schematic structural view showing optical variable delay means of the prior art.
Figure 4:
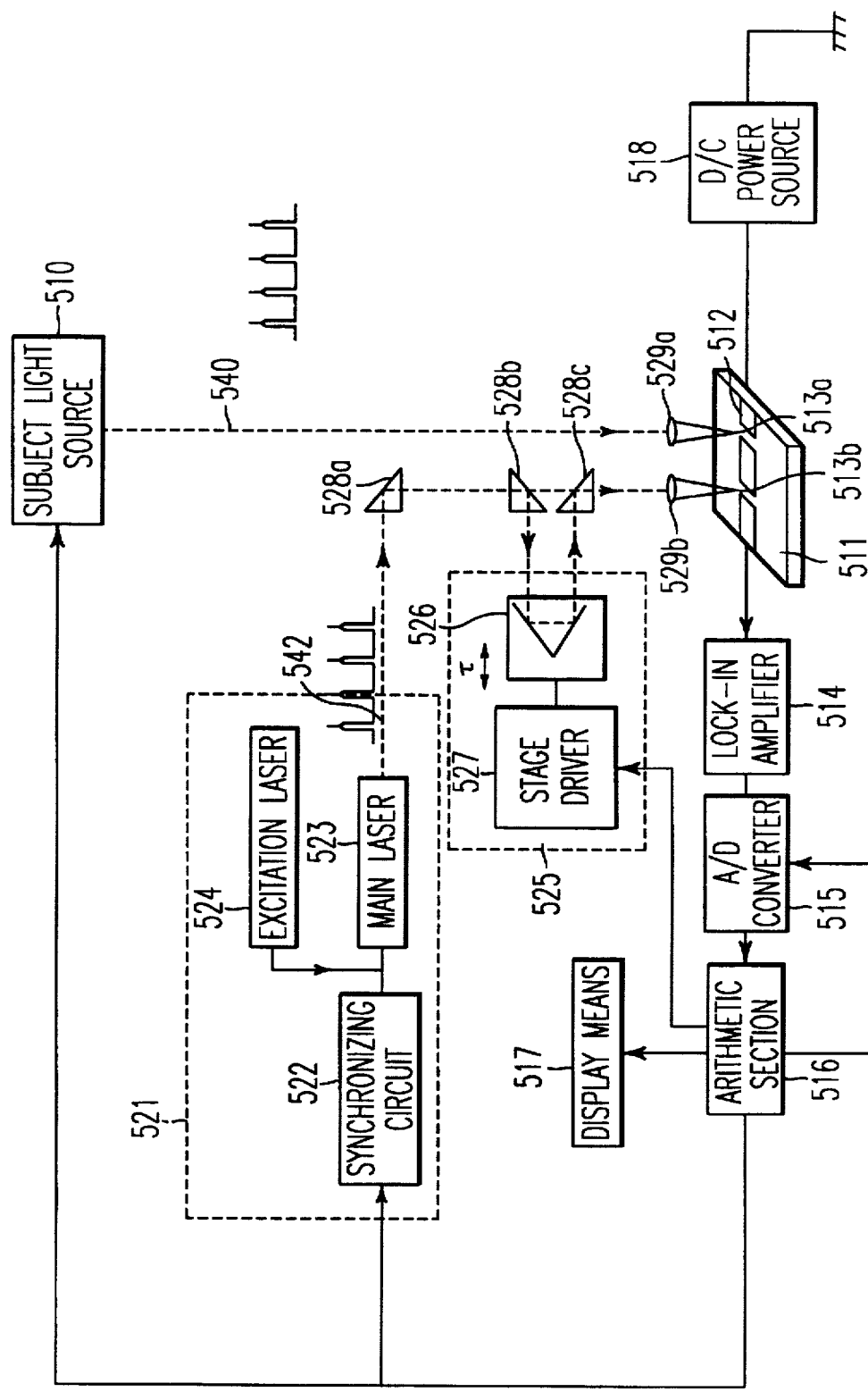
FIG. 4 shows an example of the construction of a prior-art sampling waveform measurement device in which the signals to be measured are optical pulse signals.
Figure 5:
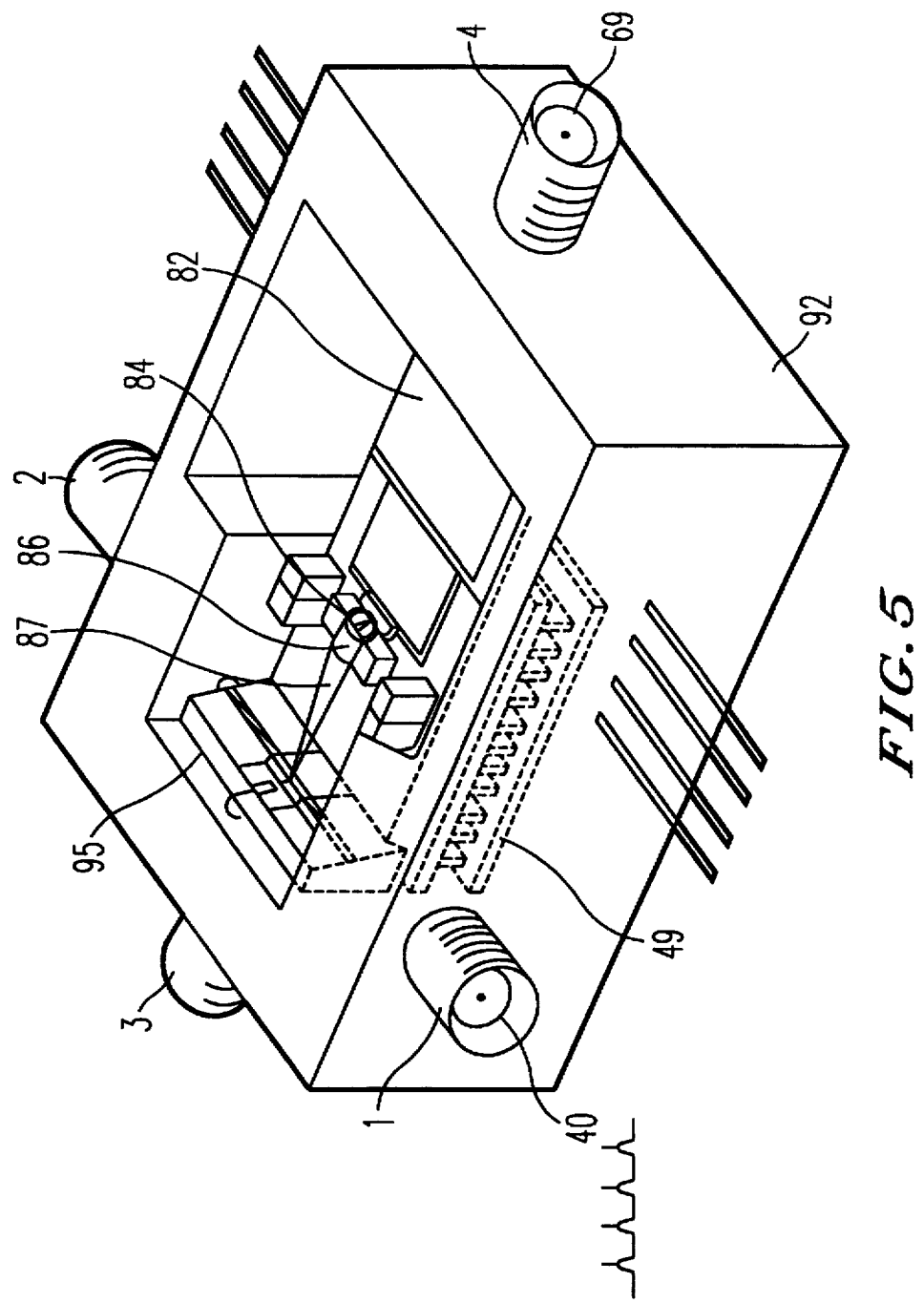
FIG. 5 is a structural view of a sampler module according to one embodiment of the present invention in which the signals to be measured are electrical pulse signals.

FIG. 5 shows the construction of a sampler module according one embodiment of the present invention in which the subject signals are electric pulse signals. This sampler module is of a construction that integrates the laser light source for sampling, drive circuit, temperature control section, and optical semiconductor element. In more concrete terms, the construction is as follows.

As shown in FIG. 5, sampler module 80 is of construction in which LD driver circuit 82, laser diode 84, condenser 86, sampling PC (sampling photoconductor) 95, and cooling temperature control means 49 are incorporated within metal container 92, and metal container 92 is provided with four coaxial connectors 1–4.

LD driver circuit 82 both supplies a desired bias current to laser diode 84 and supplies drive signals based on a sampling pulse 69 (having a pulse width of, for example, 20 ps) inputted to coaxial connector 4.

Laser diode 84 receives the drive signals from LD driver circuit 82 and generates probe pulse light 87 for sampling having an ultra-short pulse width by a gain-switching method. This probe pulse light 87 is focused by condenser 86 and directed upon gap electrode 34 of sampling PC 95.

Cooling temperature control means 49 is provided for maintaining the temperature of laser diode 84 portion at a fixed temperature and has a temperature sensor, cooling module, a thermo-control circuit, and a heat-transferring construction. The cooling module employs one surface of a Peltier element to maintain the desired temperature conditions by absorbing heat from or applying heat to the laser diode 84 portion. The other surface of the Peltier element contacts metal container 92 and allows discharge of heat to the container exterior by way of metal container 92. To effectively discharge heat, the heat-transfer portion of metal container 92 may be provided with a large metal plate, natural convection brought about by a cooling fan, or a forced heat discharge fan may be provided. Such a construction allows stabilization of the oscillation output of laser diode 84.

Figure 6A:
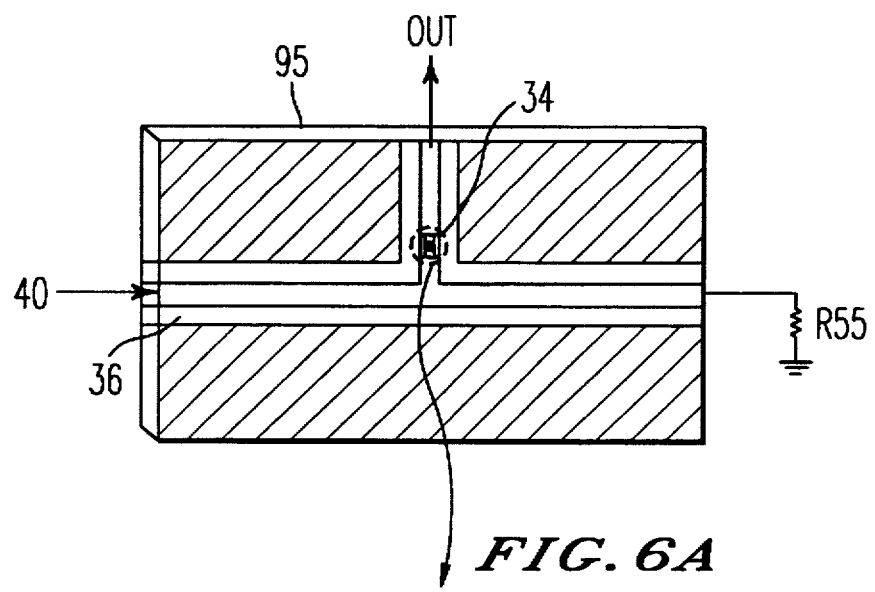
FIGS. 6(a)–6(b) shows an example of the structure of the chip pattern of sampling PC95.
Figure 6B:
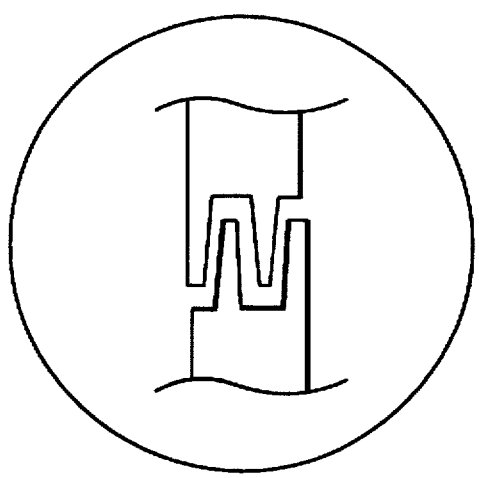

Sampling PC 95 has the same construction as examples of the prior art, and as shown in FIGS. 6(a) and 6(b) has a chip pattern construction in which signal pattern wiring 36 is formed on a semi-insulating substrate several mm square, and a pair of gap electrodes 34 are formed in the vicinity of the center of the pattern wiring. This signal pattern wiring 36 is a coplanar line.

One end of signal pattern wiring 36 is connected to a coaxial connector 1, and the other end is connected to coaxial connector 2. Coaxial connector 2 is terminated by terminal resistance R55. By this construction, subject signals 40 inputted to signal pattern wiring 36 are terminated by transmission impedance of 50Ω. As a modification of this termination configuration, coaxial connector 2 may also be omitted and termination resistance R55 directly connected to the semi-insulating substrate. A ground pattern is also formed adjacent to this signal pattern wiring 36, thereby making pattern wiring 36 a microstrip line having a prescribed transmission impedance.

Gap electrodes 34 are the core portion that constitutes the photoconductive element, and as in the prior art, take the form of opposing electrodes or comb electrodes having a gap width of several μm or less.

When gap electrodes 34 in this sampling PC 95 are irradiated by probe pulse light 87, current passes between gap electrodes 34 during the time of irradiation, and the voltage of the waveform of subject signals 40 is sampled. The sampling results are outputted from coaxial connector 3.

Together with a lid (not shown), metal container 92 forms a tightly sealed container. This metal container 92 seals the incorporated circuits from high frequencies, and moreover, forms an optically-dark box structure. This container is provided with four high-frequency coaxial connectors, and in addition, is provided with power supply terminals to LD driver circuit 82 and laser diode 84 and power supply terminals to cooling temperature control means 49. Metal container 92 and the heat discharge surface of the interior cooling module are pressure welded together, and heat generated from interior circuits is discharged to the container exterior by heat transfer. Three of the above-described coaxial connectors may be used when termination resistance R55 is incorporated within sampling PC 95.

As described hereinabove, sampler module 80 is configured such that a sampling PC 95 and an optical sampling system employing a semiconductor laser diode are compactly accommodated within a unified sealed structure, thereby achieving compact structure, low cost, and mechanical stability.

Figure 7:
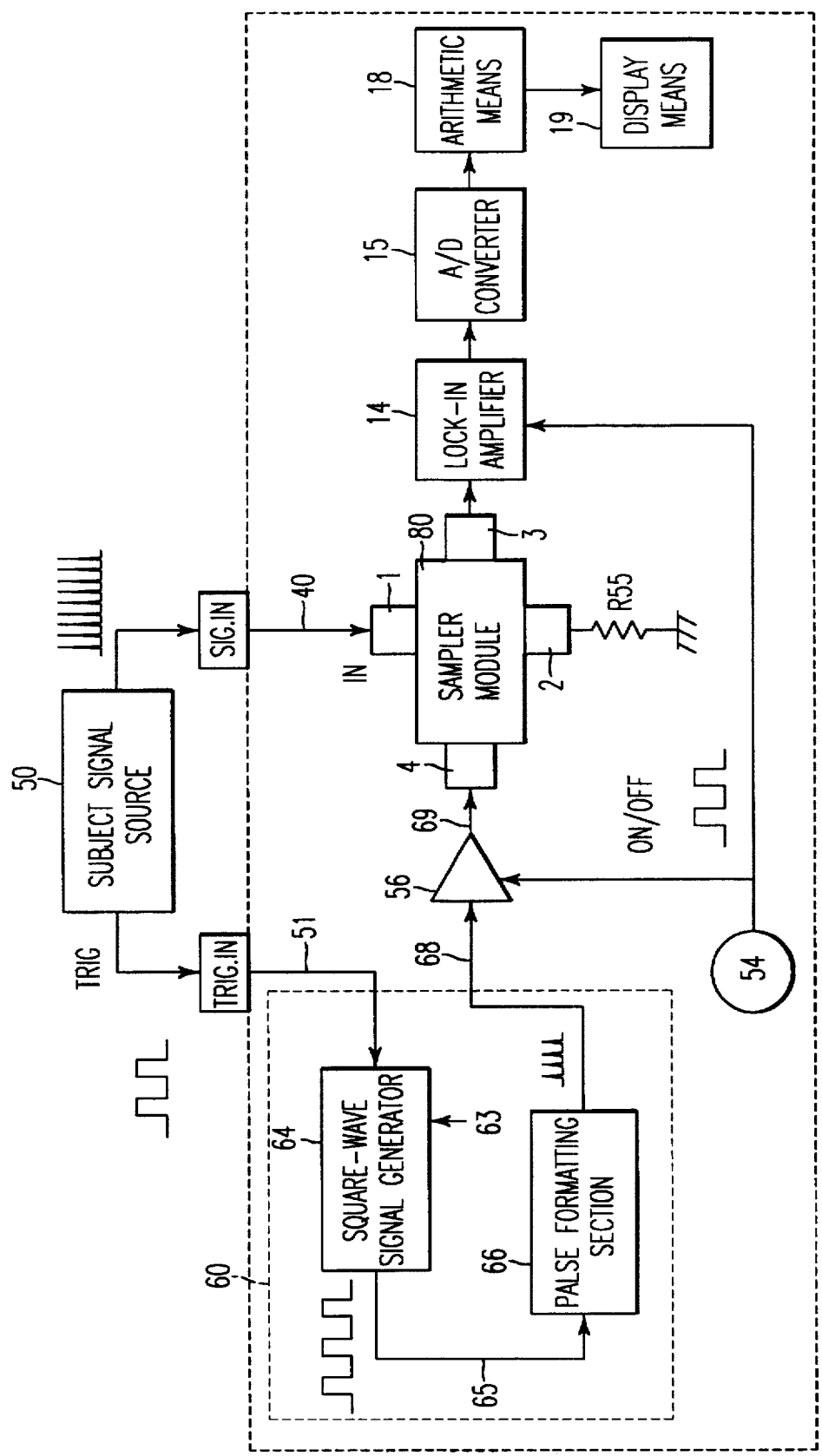
FIG. 7 is a block diagram showing the structure of a sampling waveform measurement device employing the sampler module shown in FIG. 5.

FIG. 7 shows one example of a sampling waveform measurement device that employs the above-described sampler module.

This sampling waveform measurement device is composed of a subject signal source 50, sampling pulse generator 60, square-wave signal generator 64, modulator 56, lock-in amplifier 14, sampler module 80, A/D converter 15, arithmetic means 18, and display means 19. Here, the A/D converter 15, arithmetic means 16, and display means 19 are substantially the same as the equivalent components of the prior art.

Sampling pulse generator 60 receives trigger signals 51 for synchronizing from subject signals source 50 and ramp signals 63 and generates repeating sampling pulse signals 68 of a desired timing synchronized with the subject signals 40. The sampling pulse generator 60 is composed of signal generator 64 and pulse formatting section 66.

In this example, trigger signals 51 are 1/N-frequency divided signals synchronized with subject signals 40. If the subject signal source lacks a trigger signal output terminal, a frequency-dividing circuit may be provided to 1/N-frequency divide subject signals 40 and supply the frequency divided signals to sampling pulse generator 60.

Signal generator 64 generates square wave signals while shifting the phase delay time of the square wave signals a unit amount (step time τ).

Ramp signals 63 are ramp signal inputs that confer an arbitrary phase delay to signal generator 64 at step times of τ. According to these ramp signals 63, the phase of outputted square wave signals 65 changes in succession, thereby allowing change of the sampling position of the waveform of subject signals 40.

Pulse formatting section 66 receives the square wave signals 65 from the signal generator 64 and converts them to sampling pulses 68 of extremely short pulse on the order of several tens of ps. These sampling pulses 68 are supplied to modulator 56.

In order that the output of sampler module 80 be synchronous-detection amplified at lock-in amplifier 14, modulator 56 outputs sampling pulse signals 69 ON/OFF modulated by low-speed (several KHz) square wave signal source 54 having a duty factor of 50%. These sampling pulse signals 69 are supplied to coaxial connector 4 of sampler module 80.

At sampler module 80, sampling pulse signals 69 are inputted to coaxial connector 4, subject signals 40 are inputted at coaxial connector 1, and inside, subject signals 40 are optically sampled by irradiation by laser light according to sampling pulse signals 69. The results of this sampling are outputted from coaxial connector 3 to lock-in amplifier 14.

Lock-in amplifier 14 is a coherent detection amplifier provided to enable measurement of the minute sampling signal outputted from sampler module 80 at a good S/N ratio. At the lock-in amplifier 14, integrated average-value signals of the sampling signals are coherent-detected and demodulated based on square-wave signals from low-speed square-wave signal source 54, and the result is amplified. The amplified signals are then supplied to A/D converter 15, and the subsequent processing at arithmetic means 18 and display means 19 is the same as in the prior art.

By means of the construction of the foregoing explanation, a sampling waveform measurement device can be realized employing a compact and inexpensive sampler module 80.

While the sampler module 80 according to the foregoing explanation has a construction in which the laser diode is provided separate from the photoconductor substrate, a monolithic construction may be adopted in which the laser diode is formed on a substrate which is in turn secured to the photoconductor substrate. An example of a construction in which a surface emitting type is used as an LD chip will next be explained.

Figure 8:
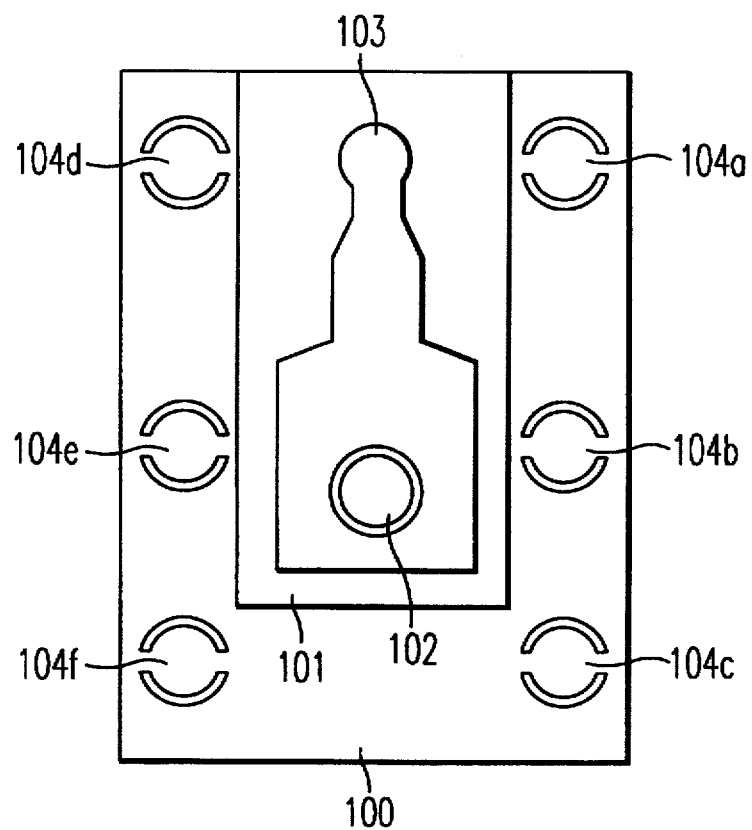
FIG. 8 shows an example of the electrode configuration of a surface-emitting LD chip.

FIG. 8 shows the electrode configuration of a surface-emitting LD chip. In this figure, 100 is a p-type electrode, 101 is an n-type electrode, 102 is a light-emitting surface, and 103 is a driver electrode. In this case, p-type electrode 100 is the ground surface upon which bump pads 104a-104f are formed. In this surface emitting LD, light is emitted from light emitting surface 102 in a perpendicular direction with respect to the substrate surface.

In the above-described surface emitting LD chip 300, because light is emitted perpendicular with respect to the substrate surface, if a flip chip is installed as explained hereinbelow, light can be irradiated directly upon the photoconductor without bending the light path by prism or mirror. In addition, because light is generated from a surface, the angle of emission is narrow and optical coupling can be achieved without interposing a lens. Finally, because the resonator is shorter than for a normal Fabry-Perot LD, the short light pulses necessary for sampling are easier to generate.

Figure 9A:
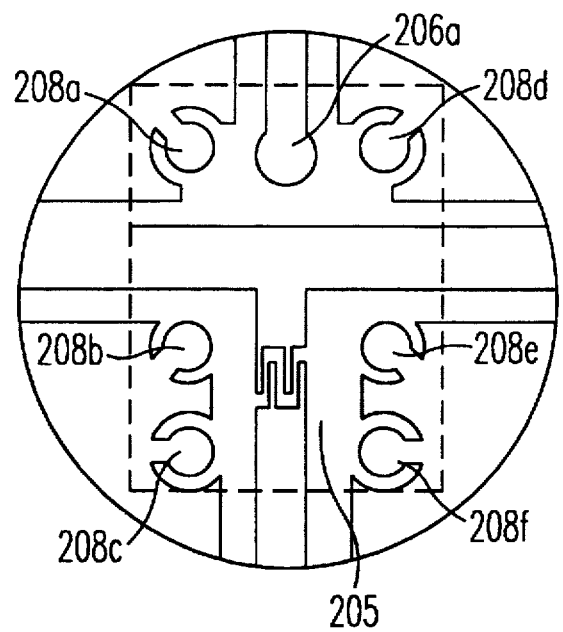
FIGS. 9(a) and 9(b) is an overhead view showing the state of the surface-emitting LD shown in FIG. 8 secured to a photoconductor.
Figure 9B:
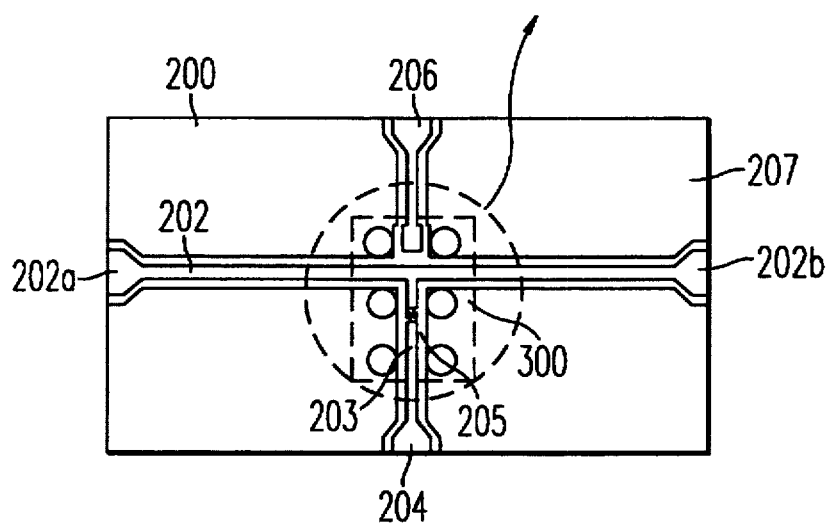
Figure 9C:
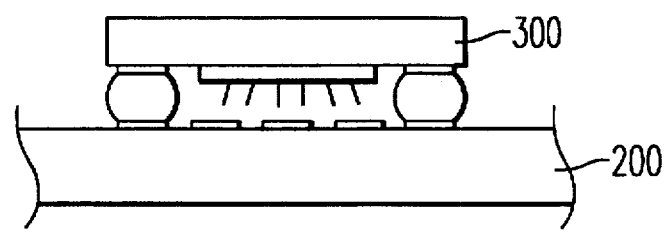
FIG. 9(c) is a side view.

FIGS. 9(a)–9(c) show the state of the above-described surface emitting LD secured on the photoconductor substrate. In these figures, 200 denotes the photoconductor, and 300 denotes the surface-emitting LD chip shown in FIG. 8.

In photoconductor 200, a transmission line 202 having transmission line input terminal 202a and transmission line termination terminal 202b and, diverging from transmission line 202, transmission line 203 having sampling port 204 are formed on a semi-insulating substrate. A comb electrode section 205 (opposing electrodes may also be employed) is formed in transmission line 203. Finally, LD drive electrode 206 for driving surface emitting LD chip 300 is formed on the semi-insulating substrate, a bump pad 206a for LD drive being formed on one end of the electrode. Ground surface 207 is formed over all portions except for transmission lines 202, 203 and LD drive electrode 206, and ground bump pads 208a–208f are formed on this ground surface 207.

Bump pads 104a–104f of surface emitting LD chip 300 are secured by solder bumps to ground bump pads 208a–208f, respectively, of ground surface 207 of the above-described photoconductor 200. In addition, LD drive bump pad 206a of photoconductor 200 is secured to drive electrode 103 of surface emitting LD chip 300 by a bump pad. Electrical contact is also established by this bump pad attachment, thereby enabling drive of surface emitting LD chip 300.

According to this arrangement, the light-emitting surface 102 of surface emitting LD chip 300 is located above comb electrode section 205 of photoconductor 200, and when surface emitting LD chip 300 is driven, light emitted from light-emitting surface 102 irradiates comb electrode section 205. According to this construction, the distance between photoconductor 200 and surface emitting LD chip 300 can be made to approach approximately 50 μm according to the characteristics of the solder bumps, and a condensing lens is therefore not required. In addition, the alignment of photoconductor 200 and surface emitting LD chip 300 can be achieved by the self-aligning effect of the solder bumps, and alignment to the optimum position can therefore be automatically achieved with the same high precision of ±1 μm at which the pad patterns are formed.

Figure 10A:
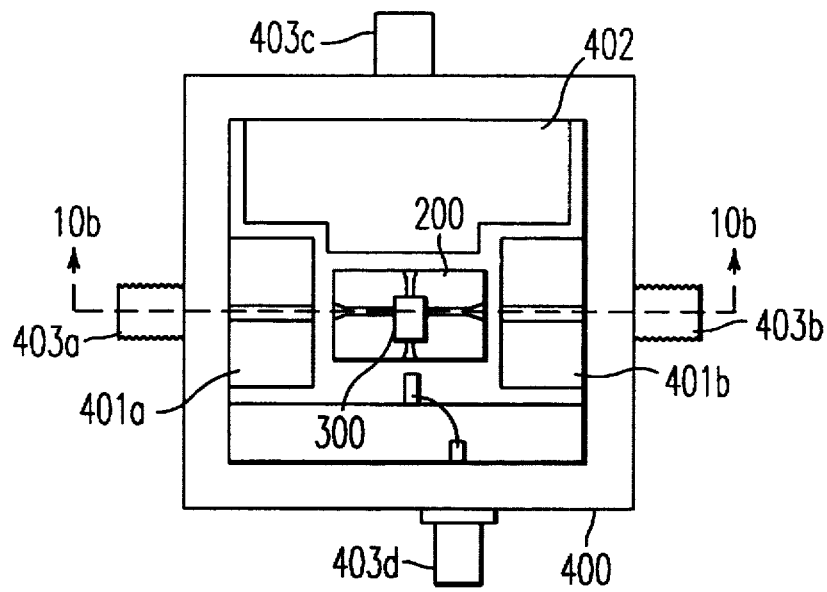
FIG. 10(a) is an overhead view showing the structure of a sampler module incorporating a photoconductor shown in FIG. 9.
Figure 10B:
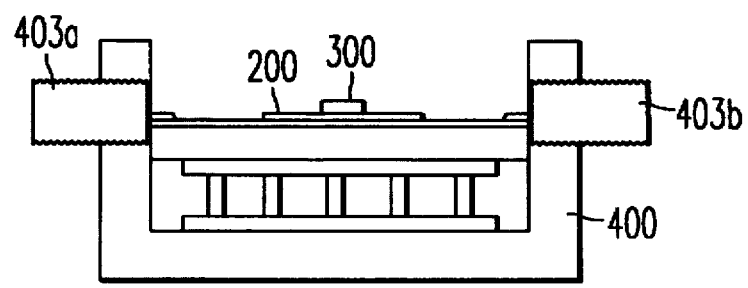
FIG. 10(b) is a sectional view taken along line A–A'.

As shown in FIG. 10, photoconductor 200 on which the above-described surface emitting LD chip 300 is mounted is in turn mounted on a base composed of metal (brass). Strip line substrates 401a and 401b in which strip lines are formed for connecting to connectors are installed at both ends of transmission line 202 of this photoconductor 200. In addition, driver IC 402 is installed at transmission line 203 for driving the LD. Each base on which components are mounted is installed on a Peltier element for maintaining a constant temperature, the entire assembly is placed inside case 400, and a high-frequency coaxial connector 403a–403c is connected to each respective substrate. One end of photoconductor 200 (the transmission line input terminal 202a side transmission line 202) is a connector for input port use, and the other end (transmission line termination terminal 202b of transmission line 202) is a connector for termination. The entire module is then charged with nitrogen, and a lid is seam welded to seal the case.

The sampler module is thus completed as described above, and by exchanging sampler module 80 of the sampling waveform measurement device shown in FIG. 7 for this sampler module, a measurement device can be provided that features excellent measurement efficiency, frequency characteristic and high reliability.

In place of a surface emitting LD chip, ordinary Fabry-Perot, DFB, or DBR LD chips may also be used.

With these types of LD chips, light is emitted along the direction of the substrate surfaces. As shown in FIG. 11, when using these types of LD chips, in addition to the Fabry-Perot, DFB, or DBR LD chip 500, waveguide 501 composed of SiO₂ and mirror 502 are formed on photoconductor 200. Mirror 502 is arranged above the comb electrode section 205 of photoconductor 200, and light emitted from LD chip 500 passes through waveguide 501 and is directed to this mirror 502.

In a device constructed in this way, light emitted from LD chip 500 passes through waveguide 501 and directed to the portion over comb electrode section of photoconductor 200, where it is reflected by mirror 502 and directed upon comb electrode section 205.

Explanation will next be presented regarding a sampling waveform measurement device in which the signals to be measured are optical pulse signals and a sampler module used in such a device. Here, a sampling waveform measurement device will be described that measures at high speed and at a high resolution of, for example, 1 ps or less, the time waveform of a light pulse continuously oscillating over several ns (1 nanosecond=$10^{-9}$ second) from a light pulse having a light pulse width of 1 ps (1 picosecond=$10^{-12}$ seconds) or less, or the time waveform of an impulse response light pulse of a tested element that takes as input such a light pulse.

Figure 12C:
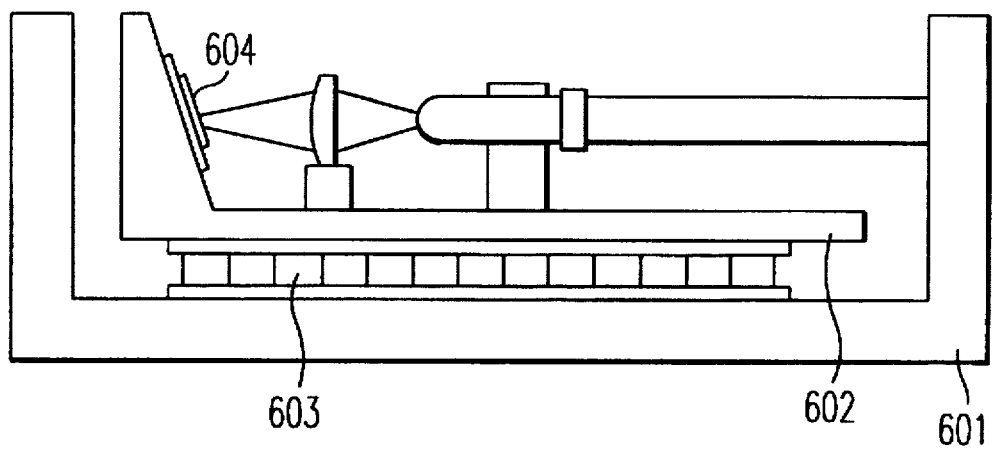
FIG. 12(c) is a side view.

FIGS. 12(a) and 12(b) present an overhead view of a sampler module according to an embodiment of the present invention in which signals to be measured are light pulse signals, and FIG. 12(c) presents a side view.

In FIGS. 12(a)–12(b), 601 denotes a metal case, within which is installed a base 602 and an interposed Peltier cooler 603. Photoconductor 604 is attached to base 602.

Figure 13:
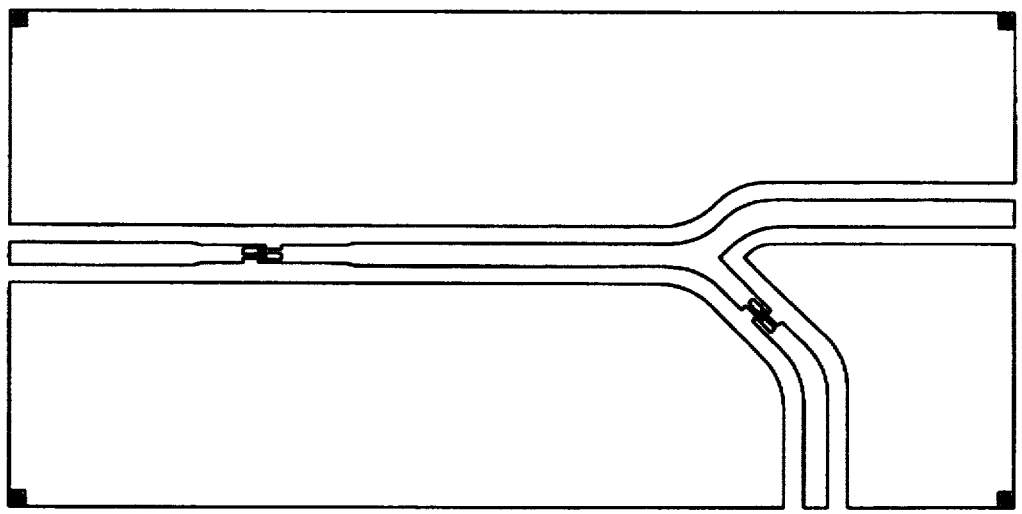
FIG. 13 shows an example of the electrode configuration of photoconductor 4 of FIG. 12.

Photoconductor 604 is constructed from a semi-insulating substrate on which is formed coplanar line 630 and, in addition, coplanar line 631 which diverges from coplanar line 630 at a right angle. First electrode (narrow gap) 632 is formed in coplanar line 630, and second electrode (narrow gap) 633 is formed in coplanar line 631. In this photoconductor 604, first and second electrode sections are made up of comb opposing electrodes as shown in FIG. 13.

Laser diode (LD) 607 is also provided on the above-described base 602, as well as a bias substrate 608 and LD driver 609, which are the means for driving the LD. These components are arranged such that optical probe pulses emitted from this LD 607 pass through lens 605b and are directed to second electrode 634 of photoconductor 604. In addition, optical fiber 606 is led into metal case 601 from the outside and is disposed such that subject light pulses emitted from ferrule 606a of this optical fiber 606 pass through lens 605a and irradiate first electrode 632 of photoconductor 604. In this case, LD driver 609 is used as the sampling light source and short light pulses are generated by, for example, a gain switching method to obtain optical probe pulses. A subject light source (not shown) such as a light soliton is connected to this optical fiber 606 by way of optical connector.

The above-described metal case 601 is provided with a DC input terminal 621, a sampling signal output terminal 622, LD drive signal input terminal 623, and termination terminal 624. DC input terminal 621 is electrically connected to one end of coplanar line 630 of photoconductor 604 such that bias voltage can be applied. Sampling signal output terminal 622 is electrically connected to the output end of coplanar line 631 of photoconductor 604, and from this sampling signal output terminal 622 are outputted the sampling signals detected by photoconductor 604. Termination terminal 624 is electrically connected to the other end of coplanar line 630. LD drive signals are inputted to LD driver 609 by way of LD drive signal input terminal 623.

In a sampler module configured according to the foregoing description, irradiated subject light pulses are photoelectric-converted at first electrode 632, and at second electrode 633, the photoelectric-converted subject light pulses are sampled based on the irradiated light probe pulses while slowly shifting delay time.

Figure 14:
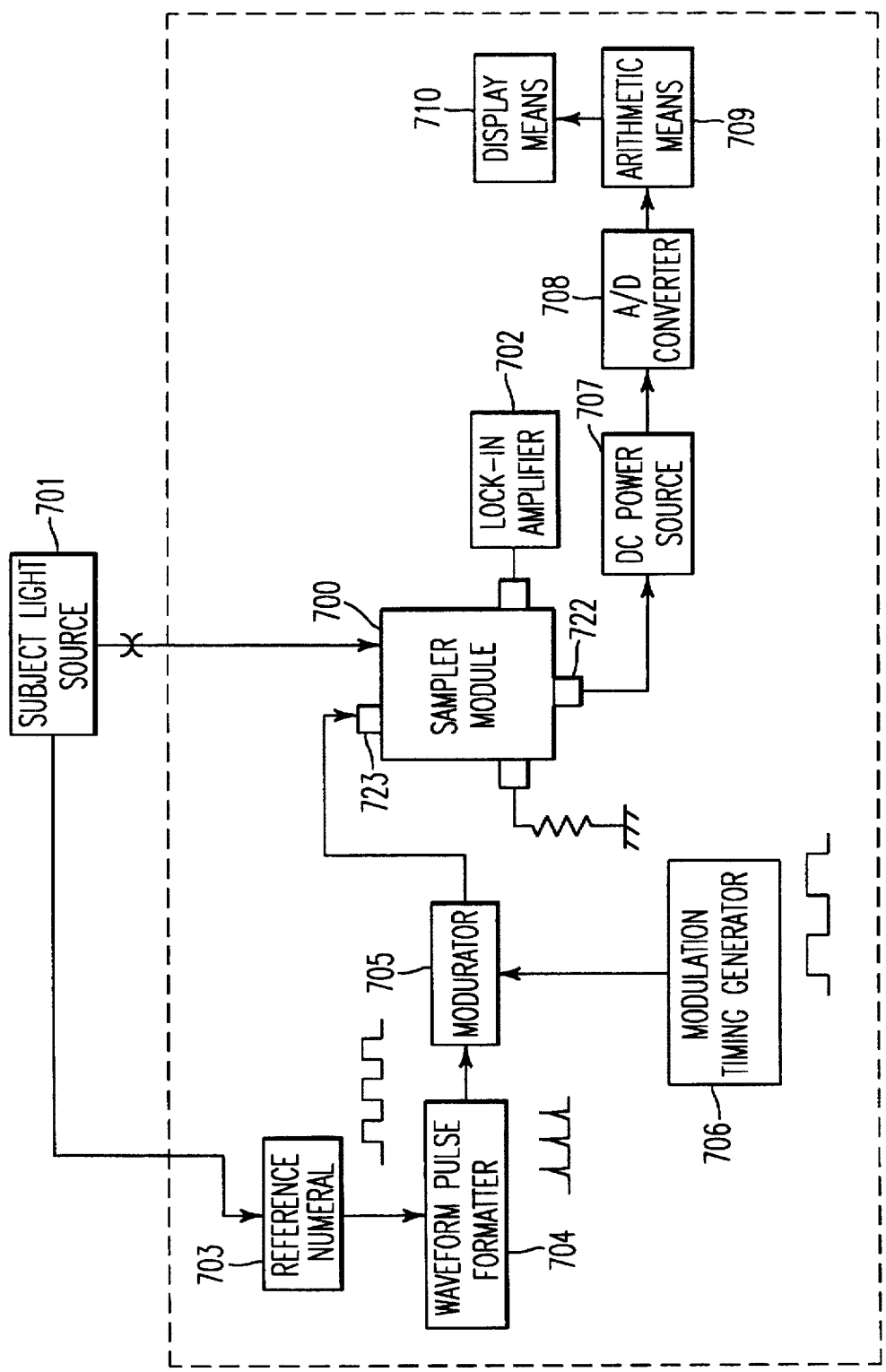
FIG. 14 is a block diagram showing an example of the construction of a sampling waveform measurement device employing the sampler module shown in FIG. 12.

FIG. 14 shows an example of the construction of a sampling waveform measurement device using the above-described sampler module.

In FIG. 14, the sampler module shown in FIG. 12 is denoted by numeral 700. Subject light source 701 is connected to optical fiber 606 of this sampler module 700 by way of an optical connector, and DC power source 702 is connected to DC input terminal 621. Termination terminal 624 is connected to ground by way of a termination resistance.

Reference numeral 703 denotes timing generator (TG), which inputs trigger signals from subject light source 701, and, based on these signals, generates timing signals synchronized to subject light pulses generated from subject light source 701 and moreover, having a frequency that diverges slightly from that of the subject light pulses. TG 703 is therefore essentially a delay means by which a delay can be inserted between the subject light pulses and optical probe pulses used for sampling (to be explained) such that subject light pulses can be sampled while slowly shifting delay time. A photoelectric conversion means for performing photoelectric conversion of subject light pulses may further be provided, and, based on the electric signals resulting from photoelectric conversion by this photoelectric conversion means, timing signals can be generated that are synchronized to these electric signals, and moreover, have a shifted frequency, thereby allowing insertion of a phase difference between the subject pulses and the optical probe pulses.

Timing signals (square waves) from the above-described TG 703 are inputted to the LD drive signal input terminal 723 of sampler module 700 by way of waveform pulse formatter 704 and modulator 705. Waveform pulse formatter 704 converts the timing signals (square waves) from TG 703 to sampling pulses having a probe-shaped waveform. The sampling pulse generator is made up of TG 703 and waveform pulse formatter 704.

Modulator 705 is ON/OFF controlled by modulation timing generator 706 which generates low-speed (several KHz) square waves having a duty factor of, for example, 50% and modulates sampling pulses from waveform pulse formatter 704 for coherent detection amplification by a lock-in amplifier to be explained. The supply means for supplying sampling pulses is constituted by modulator 705 and modulation timing generator 706.

The output of sampling signal output terminal 722 (or 622) of the above-described sampler module 700 is inputted to arithmetic means 709 by way of lock-in amplifier 707 and A/D converter 708. In this case, lock-in amplifier 707 is a coherent detection amplifier used to measure the minute signals at a good S/N ratio. Arithmetic means 709 performs a deconvolution operation on sampling signals A/D converted from A/D converter 708. These components constitute a recall arithmetic means that performs a reconstruction computation of the sampling waveform.

The computation results of the above-described arithmetic means 709 are displayed on display means 710. This display means 710 may take any form such as, for example, a CRT display or a print out. In addition, the display means may include display at another location by data transmission, display following data processing, or display following temporary storage.

In a sampling waveform measurement device constructed according to the foregoing description, subject light pulses from subject light source 701 are directed upon first electrodes 632 of photoconductor 604 within sampler module 700 by way of optical fiber 606. In addition, LD driver 609 is driven by sampling pulses based on timing signals from TG 703, and optical probe pulses emitted from LD 607 are directed upon second electrodes 633 of photoconductor 604. Subject light pulses are then photoelectric converted by first electrodes 632, and sampling is performed while gradually shifting the time of the photoelectric converted subject light pulses at second electrodes 633. The results of this sampling are outputted from sampling signal output terminal 622 of sampler module 700.

The sampling signals outputted from sampling signal output terminal 722 (or 622) are inputted by way of lock-in amplifier 707 and A/D converter 708 to arithmetic means 709, where deconvolution computation is carried out. The computation result, i.e., the original waveform, is displayed on display means 710.

In the foregoing explanation, sampler module 700 is constructed with the laser diode provided separate from the photoconductor substrate, but the laser diode may also be formed on a substrate which is then secured on the photoconductor substrate to produce a monolithic structure. An example of a construction will next be explained in which the employed LD chip is a surface emitting chip.

Figure 15:
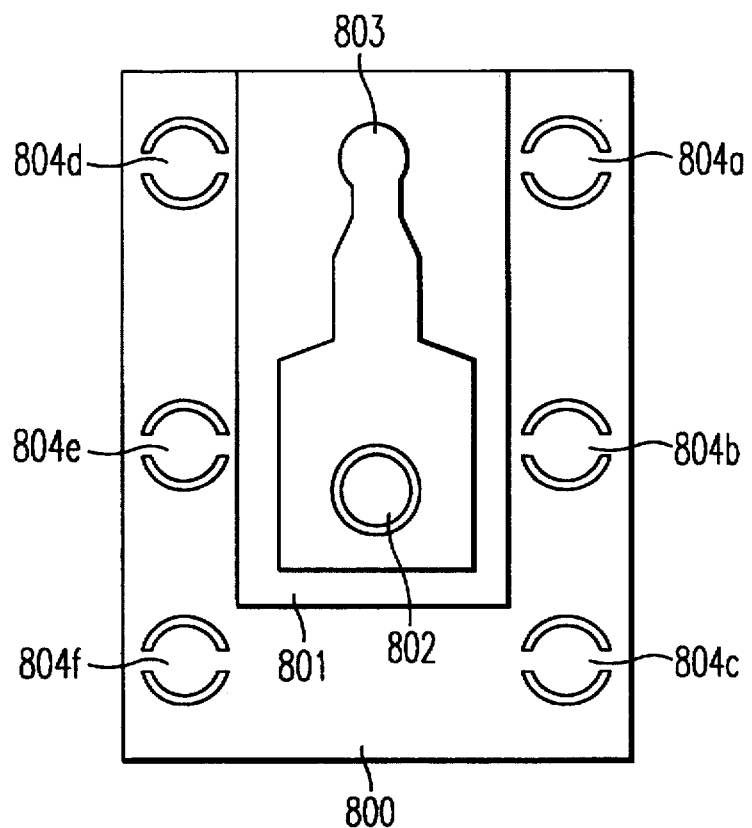
FIG. 15 shows the electrode configuration of a surface-emitting LD chip.

FIG. 15 shows the configuration of electrodes of a surface emitting LD chip. In this figure, 800 denotes a p-type electrode, 801 an n-type electrode, 802 a light-emitting surface, and 803 a drive electrode. In this case, p-type electrode 800 is a ground surface upon which bump pads 804a–804f are formed. With this surface emitting LD, light is emitted from light emitting surface 802 perpendicular with respect to the substrate surface.

In the above-described surface emitting LD chip, because light is emitted in a direction perpendicular with respect to the substrate, if a flip chip is installed as explained hereinbelow, light can be directed upon the photoconductor without bending the light path by prism or mirror. In addition, because light is generated from the surface, the angle of emission is narrow and optical coupling can be achieved without interposing a lens. Finally, because the resonator is shorter than for an ordinary Fabry-Perot LD, the short light pulses necessary for sampling are easier to generate.

Figure 16A:
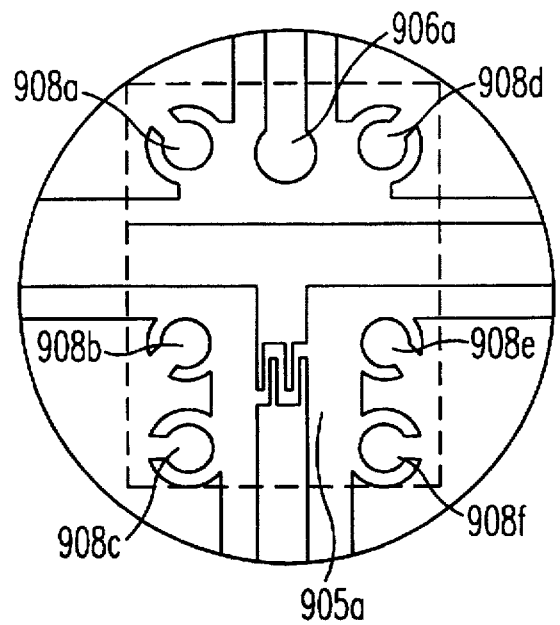
FIGS. 16(a)–16(c) shows the state in which the surface-emitting LD chip shown in FIG. 15 is affixed to a photoconductor substrate.
Figure 16B:
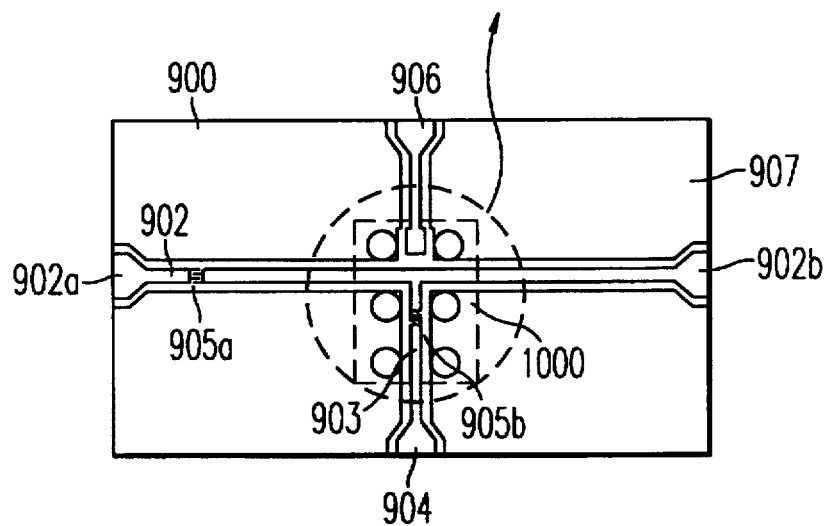
Figure 16C:
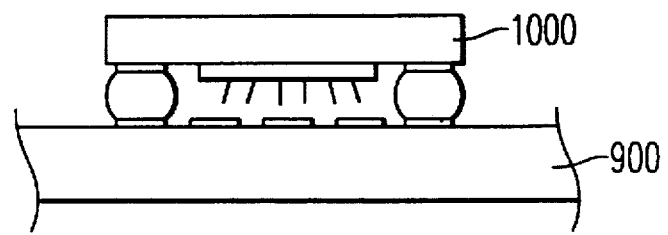

FIGS. 16(a)–16(c) show the state of the above-described surface emitting LD secured to the photoconductor substrate. In these figure, 900 denotes the photoconductor, and 1000 denotes the surface emitting LD chip shown in FIG. 15.

In photoconductor 900, a transmission line 902 having transmission line input terminal 902a and transmission line termination terminal 902b and, diverging from transmission line 902, transmission line 903 having sampling port 904 as a terminal are formed on a semi-insulating substrate. A comb electrode section 905a is formed in transmission line 902, and a comb electrode section 905b is formed in transmission line 903. Either of comb electrode sections 905a and 905b may also be opposing electrodes.

LD drive electrode 906 for driving surface emitting LD chip 1000 is formed on the semi-insulating substrate, and a bump pad 906a for LD drive use is formed on one end of electrode 906. Gland surface 907 is formed over all portions excepting these transmission lines 902, 903 and LD drive electrode 906, and ground bump pads 908a–908f are formed on this ground surface 907.

Bump pads 804a–804f of surface emitting LD chip 1000 are secured by solder bumps to ground bump pads 908a–908f, respectively, of ground surface 907 of the above-described photoconductor 900. In addition, LD drive bump pad 906a of photoconductor 900 is secured by a bump pad to drive electrode 803 of surface emitting LD chip 1000. Electrical contact is also established by this bump pad attachment, thereby enabling drive of surface emitting LD chip 1000.

According to this arrangement, the light-emitting surface 802 of surface emitting LD chip 1000 is located above comb electrode section 905b of photoconductor 900, and when surface emitting LD chip 1000 is driven, light emitted from light-emitting surface 802 irradiates comb electrode section 905.

According to this construction, the distance between photoconductor 900 and surface emitting LD chip 1000 can be made to approach approximately 50 μm according to the characteristics of the solder bumps, and a condensing lens is therefore not required. In addition, the alignment of photoconductor 900 and surface emitting LD chip 1000 can be achieved by the self-aligning effect of the solder bumps, and alignment to the optimum position can therefore be automatically achieved with the same high precision of ±1 μm with which the pad patterns are formed.

An ordinary Fabry-Perot, DFB, or DBR LD chip may also be used in place of the surface emitting type, and regardless of the type used, the chip construction is as shown in FIG. 11 described hereinabove.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An optically pre-aligned sampler module housed in a metal container and used as an optical sampling device that samples input signals under measurement from an input signal source by irradiating short-pulse laser light, comprising:

a laser diode (LD) driver circuit that receives input laser-drive sampling pulse signals from an external source and supplies short electric pulses by employing a gain switching method;

a laser diode that receives said short electric pulses from said LD driver circuit and generates optical probe pulse light as said irradiated short-pulse laser light;

a sampling photoconductor, permanently optically pre-aligned with said laser diode, and that performs switching in accordance with said generated optical probe pulse light and samples said input signals;

a condenser lens, permanently optically pre-aligned with said laser diode and said photoconductor, and that focuses the optical probe pulse light from said laser diode onto said photoconductor; and cooling temperature control means that maintains temperature of said laser diode at a fixed temperature;

wherein said sampler module is permanently optically pre-aligned at a time of fabrication.

2. A sampler module according to claim 1, wherein said input signals are electric pulse signals, said sampling photoconductor is provided with comb electrodes that perform switching in accordance with said generated optical probe pulse light, and said electric pulse signals are sampled through the switching operation at said comb electrodes.

3. A sampler module according to claim 2, wherein said sampling photoconductor is constructed by forming on a semi-insulating semiconductor substrate a first coplanar line, one end of which is an input terminal of said electric pulse signals and the other end of which is connected to termination resistance, and a second coplanar line diverging from said first coplanar line and forming said comb electrodes which comprise a narrow gap on said second coplanar line.

4. A sampler module according to claim 1, further comprising:

an optical fiber;

wherein said input signals are light pulse signals, and said optical fiber conducts said light pulse signals from the input signal source and a said condenser lens focuses light pulses emitted from said optical fiber; and said sampling photoconductor is provided with first comb electrodes that perform photoelectric conversion of said light pulse signals and second comb electrodes that perform switching in accordance with said generated optical probe pulse light, and electric signals that have been photoelectrically converted by said first comb electrodes are sampled by a switching operation of said second comb electrodes.

5. A sampler module according to claim 4, wherein said sampling photoconductor is constructed by forming on a semi-insulating semiconductor substrate a first coplanar line, at one end of which a predetermined DC voltage is provided and another end of which is connected to termination resistance, and a second coplanar line diverging from said first coplanar line, and forming said first and second comb electrodes, each comprising a narrow gap, on said first and second coplanar lines, respectively.

6. A sampler module according to claim 1, wherein said cooling temperature control means comprises:

a cooling module that maintains said laser diode at a fixed temperature by absorbing or applying heat; and a heat radiation structure that discharges heat from said cooling module to an exterior surface of said metal container through heat transfer of said metal container.

7. A sampler module according to claim 1, comprising:

an integrated structure in which said laser diode secured on a substrate upon which said sampling photoconductor is formed.

8. A sampler module according to claim 7, wherein said laser diode is a surface emitting laser diode.

9. A sampling waveform measurement device that samples input signals under measurement from an input signal source and measures the waveform of said input signals, comprising:

a sampler module housed in a metal container that samples the input signals by irradiating short-pulse laser light, including, a laser diode (LD) driver circuit that receives input laser drive sampling pulse signals and supplies short electric pulses by employing a gain switching method, a laser diode that receives said short electric pulses from said LD driver circuit and generates optical probe pulse light, a sampling photoconductor that performs switching in accordance with said optical probe pulse light and samples said input signals, a condenser lens that focuses the optical probe pulse light from said laser diode onto said photoconductor, and cooling temperature control means that maintains temperature of said laser diode at a fixed temperature;

a sampling pulse generator means that generates sampling pulse signals synchronized with said input signals;

supplying means that receives said sampling pulse signals, modulates said sampling pulse signals by a prescribed square wave signal, and supplies the modulated sampling pulse signals to said sampler module as said laser drive sampling pulse signals;

reconstruction computation means that reconstructs sampling waveforms sampled by said sampler module; and display means that displays a waveform reconstructed by said reconstruction computation means.

10. A sampling waveform measurement device according to claim 9, wherein said sampling pulse generator means changes the phase of sampling in said sampler module.

11. A sampling waveform measurement device according to claim 10 wherein said input signals are electric pulse signals, and wherein said sampling pulse generator means receives input synchronizing trigger signals from said input signal source, outputs sampling pulses synchronized with said synchronizing trigger signals and having a shifted frequency, and inserts a phase difference between said input signals and said sampling pulse signals.

12. A sampling waveform measurement device according to claim 10 wherein said input signals are electric pulse signals and further comprising:

a frequency divider that frequency divides said electric pulse signals.

13. A sampling waveform measurement device according to claim 10, wherein said input signals are electric pulse signals, and wherein said sampling pulse generator means receives input synchronizing trigger signals from said input signal source, outputs sampling pulses synchronized with said synchronizing trigger signals and having a shifted frequency, and inserts a phase difference between said input signals and said sampling pulse signals.

14. A sampling waveform measurement device according to claim 13, wherein said input signals are optical pulse signals, and further comprising:

a photoelectric conversion means that performs photoelectric conversion of said optical pulse signals.

15. A sampling waveform measurement method performed in a sampling waveform measurement device according to any of claims 9 to 14, comprising the steps of:

obtaining trigger signals based on said input signals;

generating sampling pulse signals that are synchronized with said trigger signals and shifted in frequency; and measuring the sampling waveform of said input signals by changing the sampling phase of said sampling pulses.

* * * * *

UNITED STATES PATENT AND TRADEMARK OFFICE
CERTIFICATE OF CORRECTION

PATENT NO. : 5,801,375
DATED : September 1, 1998
INVENTOR(S) : Kouji SASAKI, et al.

It is certified that error appears in the above-identified patent and that said Letters Patent is hereby corrected as shown below:

On the title page, Item [54] and at the top of column 1, the title, is incorrect. It should read:

--SAMPLER MODULE, SAMPLING WAVEFORM MEASUREMENT DEVICE
  USING THE SAMPLER MODULE, AND SAMPLING WAVEFORM
  MEASUREMENT METHOD--

Signed and Sealed this

Fourth Day of May, 1999

Q. TODD DICKINSON

*Attest:*

*Attesting Officer*   Acting Commissioner of Patents and Trademarks